(12) United States Patent
Knecht

(10) Patent No.: US 6,653,906 B1
(45) Date of Patent: Nov. 25, 2003

(54) CONTROLLABLE SAW OSCILLATOR COMPONENT

(75) Inventor: Thomas A. Knecht, West Dundee, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/178,108

(22) Filed: Jun. 24, 2002

(51) Int. Cl.$^7$ ............................................... H03B 11/10
(52) U.S. Cl. ........................... 331/107 DP; 331/107 A; 331/177 V
(58) Field of Search .................... 331/177 V, 108 C, 331/107 A, 107 DP, 154, 68

(56) References Cited

U.S. PATENT DOCUMENTS

| | | | |
|---|---|---|---|
| 3,936,765 A | 2/1976 | Lewis et al. | 331/1 R |
| 4,862,110 A | 8/1989 | Charbonnier | 331/70 |
| 5,126,694 A | 6/1992 | Montress et al. | 331/18 |
| 5,352,993 A | 10/1994 | Mäder | 331/107 A |
| 5,500,628 A | 3/1996 | Knecht | 331/68 |
| 5,721,515 A | 2/1998 | Northan et al. | 331/107 A |
| 5,874,866 A * | 2/1999 | Satoh et al. | 331/107 A |
| 6,239,664 B1 | 5/2001 | Northam | 331/108 R |

OTHER PUBLICATIONS

U.S. patent application Ser. No. 10/047,249, Knecht et al., filed Jan. 2002.

* cited by examiner

Primary Examiner—Terry D. Cunningham
Assistant Examiner—Quan Tra
(74) Attorney, Agent, or Firm—Steven Weseman; Mark Borgman

(57) ABSTRACT

A frequency-adjustable oscillator suitable for digital signal clock synchronization comprises a SAW oscillator circuit for generating an analog controlled-frequency signal and a sinewave-to-logic level translator circuit in a double-sided package. The SAW oscillator circuit includes a tunable SAW resonator, a gain stage for energizing the SAW resonator, a voltage-variable control input for adjusting a frequency of the controlled-frequency signal, and a voltage-variable capacitive element operably linked to the SAW resonator and responsive to the control input. The sinewave-to-logic level translator circuit is operably linked to the SAW oscillator circuit and configured to generate a digital logic output signal having substantially the same frequency as the controlled-frequency output signal. The double-sided package includes a platform with sidewalls extending substantially upwardly to form a first cavity adapted to receive and electrically connect the SAW resonator and sidewalls extending substantially downwardly to form a second cavity adapted to receive and electrically connect at least one electronic component. A cover is coupled with the first cavity to create an isolated environment for containing the SAW resonator.

22 Claims, 5 Drawing Sheets

CONTROLLABLE SAW OSCILLATOR COMPONENT

TECHNICAL FIELD

This invention relates to voltage controlled surface acoustic wave oscillators, and in particular, to cost-effective packaged configurations for relatively high-frequency surface acoustic wave controlled-frequency oscillators.

BACKGROUND

High capacity data networks rely on signal repeaters and sensitive receivers for low-error data transmission. To decode and/or cleanly retransmit a serial data signal, such network components include components for creating a data timing signal having the same phase and frequency as the data signal. This step of creating a timing signal has been labeled "clock recovery."

Data clock recovery requires a relatively high purity reference signal to serve as a starting point for matching the serial data signal clock rate and also requires circuitry for frequency adjustment. The type, cost and quality of the technology employed to generate the high purity reference signal varies according to the class of data network application. For fixed large-scale installations, an "atomic" clock may serve as the ultimate source of the reference signal. For remote or movable systems, components including specially configured quartz resonators have been used. As communication network technology progresses towards providing higher bandwidth interconnections to local area networks and computer workstations, the need has grown for smaller and less-expensive clock recovery technology solutions.

For many clock recovery applications, the reference signal generator must be adjustable, i.e., controllable, over a precisely defined operating curve. This adjustability requirement is conveniently defined as an Absolute Pull Range (APR). APR is defined as the controllable frequency deviation (specified in +ppm) from the nominal frequency ($F_0$) over a wide range of operating parameters, including supply voltage variations, temperature variations, output load variations, and time (i.e., aging). Clock recovery may require controllable oscillators having both a minimum and a maximum APR.

For higher frequency applications now in demand, e.g., above 500 MHz, more conventional resonator technologies such as standard AT-cut crystals have not been fully successful. The recognized upper limit for fundamental-mode, straight blank AT-cut crystals is about 70 MHz.

There continues to be a need for a cost-effective voltage controlled oscillator suitable for data signal clock recovery applications. In particular, there remains a need for lower cost SAW oscillator components. Most communicating devices employing clock recovery oscillators are produced in automated factories in mass volumes. The associated market favors smaller designs and consumer-level pricing. Towards these objectives rigorous attention is applied to electronic component costs and sizes. Cost and size constraints are important factors in crystal oscillator design.

Because even dust-size contamination of SAW resonators affects center frequencies, packaging and handling for SAW oscillator components is critical. SAW based oscillators are assembled in clean room environments, where the SAW resonator is sealed or encapsulated such that a chamber is formed over the active surface of the SAW substrate. Inert, dust-free atmospheres are created in the sealed SAW resonator chamber. These special packaging and handling requirements not only contribute to the cost of manufacturing oscillator components but also limit efforts at reducing the overall package size.

SUMMARY

A controllable oscillator suitable for use in digital signal clock synchronization is provided. The controllable oscillator comprises a SAW oscillator circuit for generating an analog controlled-frequency output signal, a sinewave-to-logic level translator circuit, and a double-sided package.

The SAW oscillator circuit includes a voltage-variable control input for adjusting a frequency of the controlled-frequency output signal, a voltage variable capacitive element responsive to the control input, a surface acoustic wave (SAW) resonator operably linked to the voltage variable capacitive element, and a gain stage for energizing the SAW resonator.

A sinewave-to-logic level translator circuit is operably linked to the SAW oscillator circuit for generating a digital logic output signal having substantially the same frequency as the controlled-frequency output signal.

The SAW oscillator circuit and translator circuit are configured on a double-sided package including a platform having a central portion and an outer portion. Sidewalls extend substantially upwardly and substantially downwardly from the outer portion of the platform. The upwardly extending sidewalls and the platform form a first cavity adapted to receive and electrically connect the SAW resonator. The downwardly extending sidewalls and the platform form a second cavity adapted to receive and electrically connect at least one electronic component. A cover is coupled with the first cavity to define a hermetic environment for containing the SAW resonator.

The packaged oscillator preferably also includes a laminate substrate coupled with the second cavity. In this preferred embodiment, the package platform has a second-cavity side with at least one electronic component mounted on this second-cavity side. The laminate substrate cover has a cavity facing side to receive at least one electronic component and an outward facing side which includes contacts to facilitate surface mounting.

There are other advantages and features of this invention which will be more readily apparent from the following detailed description of the preferred embodiment of the invention, the drawings, and the appended claims.

BRIEF DESCRIPTION OF THE FIGURES

In the accompanying drawings that form part of the specification, and in which like numerals are employed to designate like parts throughout the same.

DETAILED DESCRIPTION OF PREFERRED EMBODIMENTS

While this invention is susceptible to embodiment in many different forms, this specification and the accompanying drawings disclose only preferred forms as examples of the invention. The invention is not intended to be limited to the embodiments so described, however. The scope of the invention is identified in the appended claims.

In the FIGURES, a single block or cell may indicate several individual components and/or circuits that collectively perform a single function. Likewise, a single line may represent several individual signals or energy transmission paths for performing a particular operation.

Figure 1:
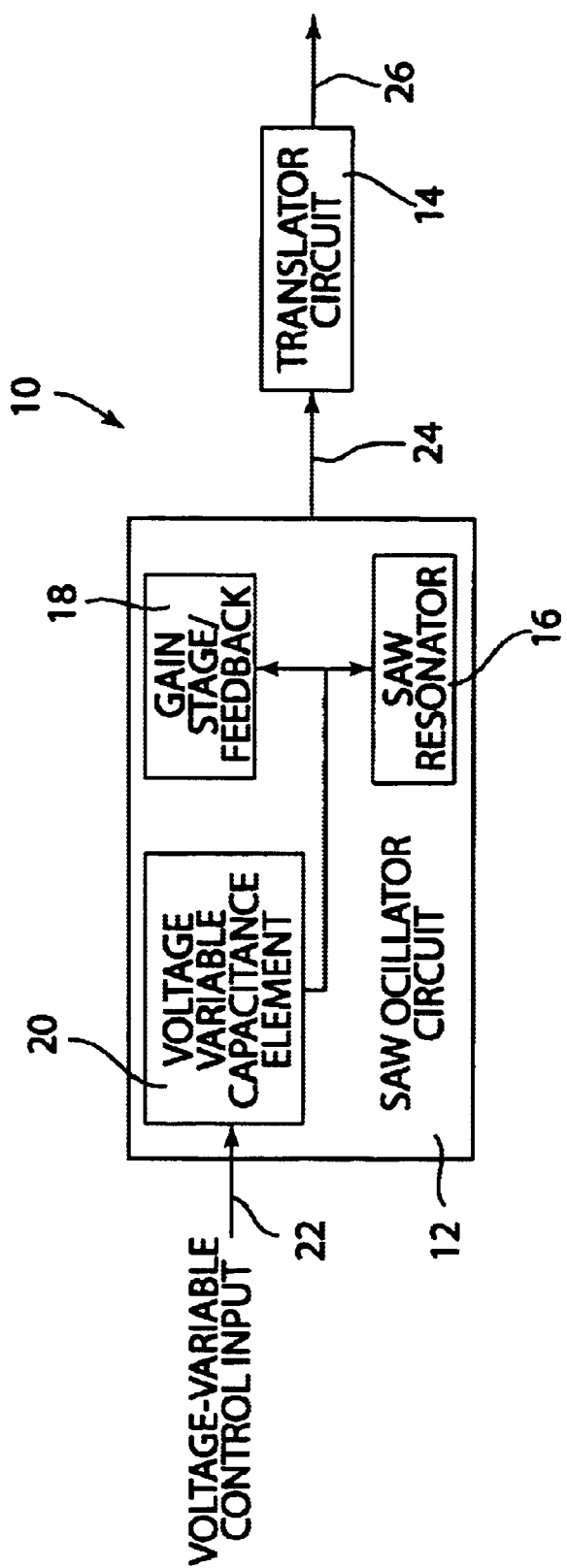
FIG. 1 is a schematic diagram of a controllable oscillator according to an embodiment of this invention.

Turning to FIG. 1, a frequency controllable oscillator 10 includes a SAW oscillator circuit 12 and a sinewave-to-logic level translator circuit 14. SAW oscillator circuit 12 includes a surface-acoustic-wave (SAW) resonator 16 operably linked to gain stage and feedback elements 18 and a voltage variable capacitance element 20. A variety of oscillator circuit configurations may be used including those referred to under the designations Pierce, Colpitts, Hartley, Clapp, Driscoll, Seiler, Butler and Miller, with Colpitts being preferred.

SAW resonator 16 is preferably a one-port SAW network and therefore compatible with a Colpitts oscillator circuit configuration. A two-port SAW resonator in a delay line oscillator circuit configuration is also suitable. SAW resonator 16 is adapted to resonate at a frequency selected according to the desired output frequency. SAW oscillating circuits according to the present invention employ SAW resonators designed to resonate at a frequency slightly above the desired output center frequency. Resonators adapted for relatively lower capacitive loads are preferred to allow a larger range for frequency control.

Voltage variable capacitance element 20 exhibits a varying capacitance in response to changes in a DC voltage-variable control input 22. A voltage change made to input 22 adjusts the capacitive load of the oscillator circuit and the frequency of its output driving signal, which is represented in FIG. 1 with numeral 24.

Input 22 is preferably voltage variable. Also contemplated for the control input is a digital number (or equivalent) input that is converted to an analog voltage signal by a conventional digital to analog converter. Voltage variable capacitance element 20 is preferably a discrete variable capacitance diode (i.e., a varactor or varactor diode) although other voltage controlled variable capacitance mechanisms are contemplated. For an embodiment with increased on-chip integration, variable capacitance element 20 includes one or more banks of transistor-switchable capacitors in a parallel circuit configuration and coupled to control logic for selectively activating capacitors in response to the control voltage. Alternatively, variable capacitance element 20 includes one or more banks of transistor-switchable on-chip varactor elements or combinations of capacitors and on-chip varactors coupled to control logic for selectively activating integrated varactors and capacitors in response to the control voltage. Circuits for providing on-chip variable capacitance suitable for temperature compensating crystal oscillators are described in U.S. Pat. No. 4,827,226, issued to Connell et al., and U.S. Pat. No. 5,994,970, issued to Cole et al., both of which are incorporated herein by reference to the extent they are not inconsistent with the present teachings.

Oscillator 10 includes translator subcircuit 22 to convert the preferably analog (i.e. sinusoidal) controlled-frequency signal 24 to a digital (or logic level) output signal 26. Translator subcircuit 22 is preferably a differential receiver (i.e., differential ECL driver) providing a digital output signal at voltage levels conventional for 10K or 100K positive-referenced emitter coupled logic (PECL), also called positive emitter-coupled logic (PECL). Other digital logic level output standards are also contemplated including signals oscillating between voltage levels conventional for a semiconductor circuit technology selected from the group consisting essentially of transistor-transistor logic, emitter coupled logic, CMOS, MOSFET, GaAS field effect, HCMOS, MESFET, HEMT or PHEMT, CML and LVDS.

Figure 2:
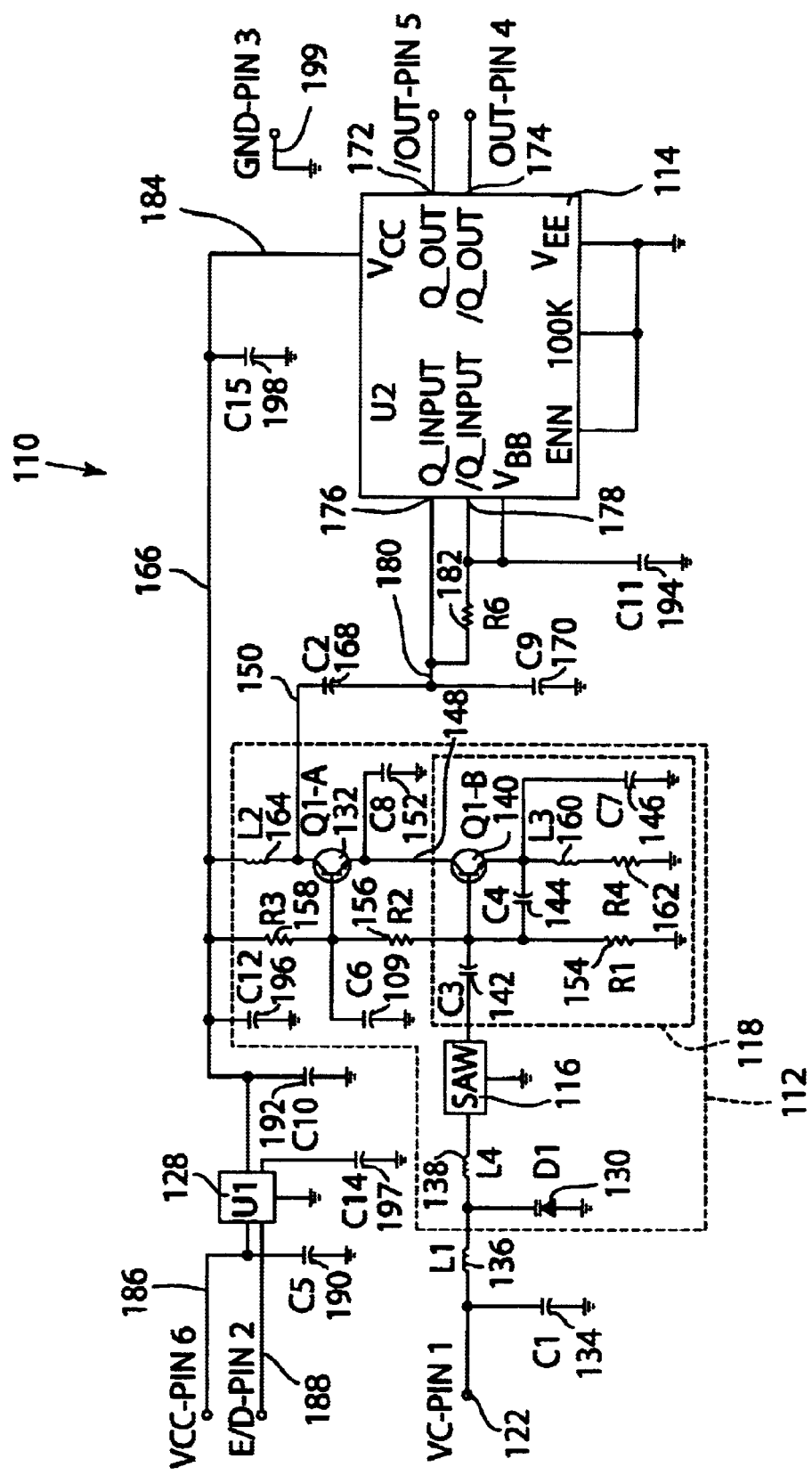
FIG. 2 is a simplified circuit diagram according to a preferred embodiment of this invention.

A batch of controllable oscillators 110 in FIG. 2 were fabricated according to an embodiment of the present invention. A simplified circuit schematic for the fabricated samples is presented in FIG. 2. FIG. 2 represents the following major circuit elements: SAW oscillator circuit 112, a gain stage/feed subcircuit 118, a sinewave-to-logic level translator 114 and input-power regulator 128.

SAW oscillator circuit 112 is a Colpitts and cascode buffer/amplifier configuration including a SAW resonator 116, a discrete varactor 130 (D1), gain stage/feedback subcircuit 118 and an output buffering transistor 132 (Q1-A). SAW resonator 116 is a single-port SAW configuration. A suitable SAW resonator is commercially available from TAI SAW TECHNOLOGY CO. Ltd. (Taoyuan, Taiwan) under the designation "TC0172A" and adapted to resonate at 622.280 MHz under a 10 picofarad load.

The bias DC voltage of varactor 130 is set by a control input 122 (VC-PIN1). Capacitor 134 (C1) and inductor 136 (L1) are provided to suppress possible AC noise. An inductor 138 (L4) is connected between varactor 130 and SAW resonator 116 (SAW) for setting the nominal reactance in the proper range.

According to the Colpitts oscillator configuration, SAW oscillator circuit 112 includes a gain stage/feedback subcircuit 118 based on an amplifying transistor 140 (Q1-B), a coupling capacitor 142 (C3), a capacitor 144 (C4) linking gate to emitter and a capacitor 146 (C7) coupling emitter to ground. Capacitor 109 (C6) is used for RF power adjustment.

Buffering transistor 132 (Q1-A) receives the oscillator circuit controlled frequency output signal at connection 148 and transfers a corresponding frequency buffered output signal at connection 150. A shunted capacitor 152 (C8) suppresses AC signals at undesired frequencies.

Resistors 154 (R1), 156 (R2) and 158 (R3) are provided to set the DC bias voltages for transistors 132 (Q1-A) and 140 (Q1-B). Circuit elements 160 (L3) and 162 (R4) are provided to stabilize transistor operation over temperature variations. Inductor 164 (L2) provides a DC connection and AC isolation between power supply bus 166 and transistor 140 (Q1-B). Elements 168 (C2) and 170 (C9) are load setting capacitors.

Circuit 110 includes a sinewave-to-logic level translator 114 (U2) in the form of a differential receiver, which receives sinewave output signal 150. A preferred differential receiver is commercially available from Arizona Microtek (Mesa, Ariz.) under the designation "AZ100LVEL16" and was used for this example. Also suitable is a chip module commercially available from Micrel Semiconductor (San Jose, Calif.) under the designation "SY10EP16V." Differential receiver module 114 provides a digital output signal according to the 100K Positive Emitter Coupled Logic (PECL) standard: logical zero is in the range from about (Vcc—1.63) volts to (Vcc—1.95) volts, logical one is in the range from about (Vcc—0.75) volts to (Vcc—0.98) volts.

The PECL output is complementary requiring two terminals 172 (Q_OUT) and 174 (/Q_OUT).

Translator 114 (U2) is adapted to receive differential inputs 176 (Q_INPUT) and 178 (/Q_INPUT). A DC bias level difference is added to the analog controlled-frequency signal present at connection 180 via a parallel resistor 182 (R6). A power input 184 (VCC) is connected to the DC power bus 166.

Frequency controllable oscillator 110 has a supply DC power input 186 (VCC-PIN6) operably and commonly linked to energize both oscillator circuit 112 and sinewave-to-logic level translator 114 at the same DC voltage level, e.g., about 3.3 Volts. Power is routed through a DC to DC regulator 128 (U1) which provides an oscillator disable function controlled by an input 188 (E/D-PIN2). Regulator 128 also allows an oscillator power supply input at a voltage level higher than is desired for the circuit components 112 and 114. For example, supply input 186 (VCC-PIN6) can be 5 volts but the regulator 128 (U1) supplies 3.3 volts (at bus 166) as may be required for translator 114.

Circuit and package design for components having signals at radio frequency (RF) include bypass capacitors to suppress parasitic signals which may be picked up on nearby circuit elements such as transistors and transmission lines. Oscillator 110 includes the following such bypass capacitors: 190 (C5), 192 (C10), 194 (C11), 196 (C12), 197 (C14) and 198 (C15). Also provided in the schematic circuit diagram of FIG. 2 is a ground connection 199 (GND-PIN3).

Figure 3:
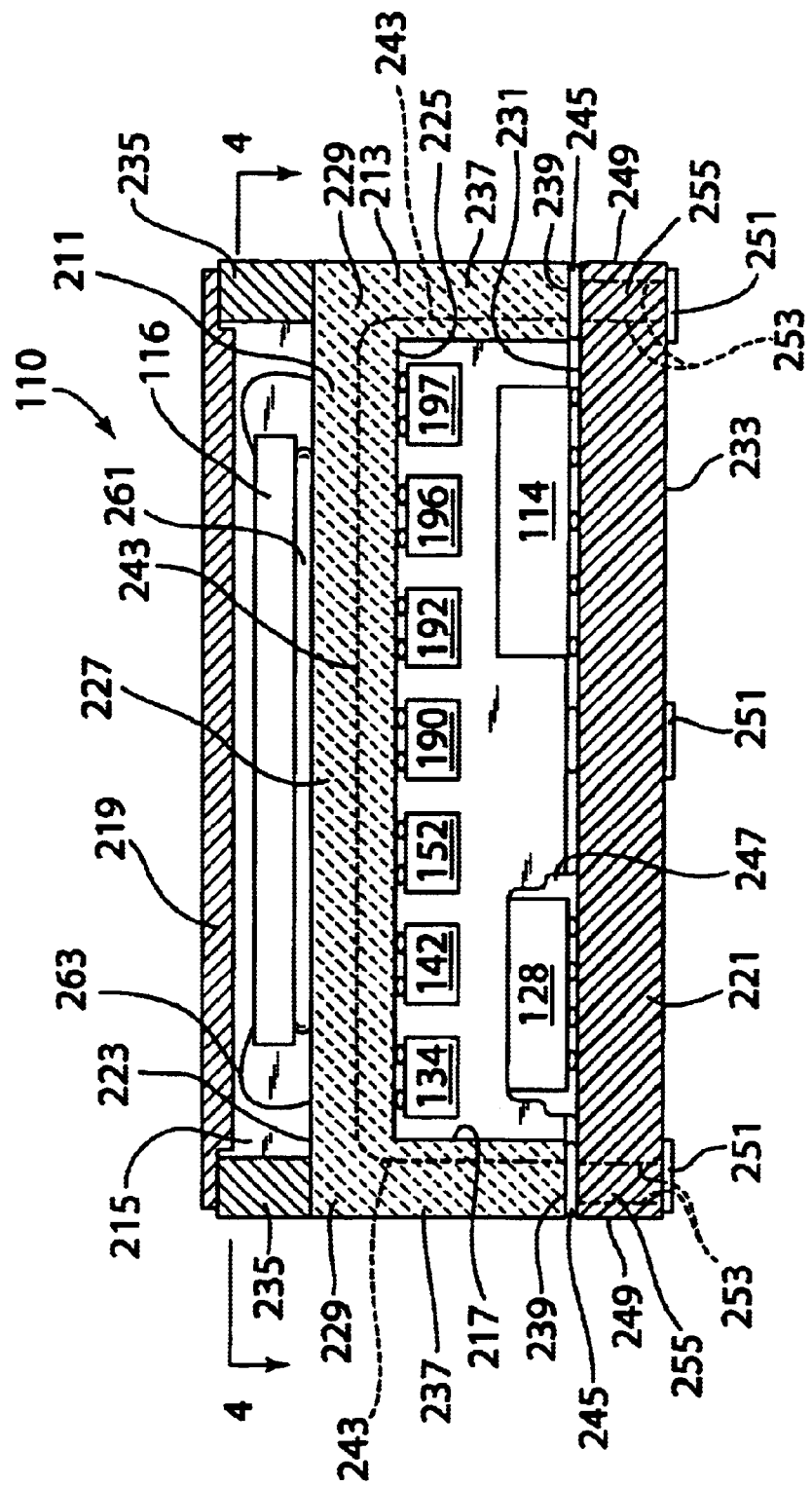
FIG. 3 is a schematic cross-section view of a packaged oscillator according to this invention.

FIG. 3 is a schematic cross-sectional view illustrating the preferred packaged configuration for voltage controlled SAW oscillator 110. An oscillator 110 relies on a double-sided package with a platform 211, a wall 213, an upper (or first) cavity 215, a lower (or second) cavity 217, a cover 219, and a laminated substrate in the form of a circuit board 221. Platform 211 has an upper surface 223, a lower surface 225, a central portion 227 and an outer portion 229. Platform 211 is configured to pass a first signal between the upper surface 223 and the lower surface 225. Lower surface 225 is configured to receive a plurality of components such as, but not limited to, chip capacitors 134, 142, 152, 190, 192, 196 and 197.

Circuit board 221 has an upper surface 231 and a lower surface 233. Upper surface 231 is configured to receive additional components. These include, but are not limited to, regulator 128 in the form of an integrated circuit and a sinewave-to-logic level translator 114 also in the form of an integrated circuit and additional chip capacitors (not separately shown). In a most preferred embodiment, the additional components are flip chip-mounted integrated circuits including an organic underfill 247 for better mechanical coupling to surface 231.

Oscillator 110 includes an upwardly extending sidewall (or wall portion) 235, a downwardly extending sidewall (or lower portion) 237 and a sidewall bottom 239. Upper portion 235 and lower portion 237 are separated by platform 211. Bottom 239 is configured to pass a signal between wall 213 and circuit board 221. Cover 219 is affixed to the upper portion 235 of the wall 213.

Lower cavity 217 is configured to receive and interconnect components. Lower cavity 217 is defined by lower surface 225 of platform 211, lower portion 237 of wall 213, and upper surface 231 of circuit board 221.

Circuit board 221 provides a planar upper (or cavity-facing) surface 231 and a planar lower (or outward facing) surface 233. Upper surface 231 has electrical components attached thereto. Circuit board 221 is configured to be coupled to lower cavity 217, and specifically to downwardly extending sidewall 237. Circuit board 221 may be, but is not limited to, a multi-layered printed circuit board (e.g., four layers). Circuit board 221 optionally includes plated half-holes at its outside edge 249, sometimes referred to as castellations, for providing additional electrical paths to and from the circuitry of the oscillator 110. Lower surface 233 of circuit board 221 includes conductive pads 251 to facilitate oscillator 110's electrical surface mountable connection to an electrical device.

Controllable SAW oscillator 110 preferably includes separate surface mount pads for the circuit input/outputs described above in reference to FIG. 2; namely, variable-voltage control input 122 (VC-PIN1), a DC power input 186 (VCC-PIN6), digital outputs 172 (OUT-PIN5) and 174 (/OUT-PIN4), an on-off switch connection 188 (E/D-PIN2), and ground 199 (GND-PIN3).

Upper cavity 215 is defined by upper surface 223 of platform 211, upper portion 235 of wall 213, and cover 219. Upper cavity 215 is hermetically sealed and is configured to receive a SAW resonator die 116. The platform 211 isolates the lower and upper cavities 217 and 215 and the components within cavities 217 and 215, thereby minimizing the possibility of contamination by providing a hermetically sealed resonator 116 that can be processed separately before the electronic components in lower cavity 217.

Oscillator 110 geometry (or form factor) can vary widely. In an embodiment, oscillator 110 is substantially rectangular or square, and is adapted for placement in an electronic device taking up a small volume of the overall volume of the electronic device. Moreover, oscillator 110 is adapted for mass production and miniaturization. For example, oscillator 110 has a footprint of approximately 5×7 millimeters (mm) or more preferably 3.2×5 mm. Likewise, oscillator 110 has a footprint of an area less than about 40 square millimeters ($mm^2$) or more preferably less than about 20 $mm^2$.

Oscillator 110 preferably is made of materials having substantially similar thermal expansion coefficients to minimize stresses within the package. In the example embodiment, platform 211 and downwardly extending sidewall 237 are made of a multi-layer co-fired ceramic material, such as alumina. Specifically preferred are co-fired ceramic materials such as alumina, produced for example through various casting or pressing techniques and having refractory, thick film or thin film metallizations.

Upwardly extending sidewall 235 preferably comprises a metal or metal alloy of tungsten, nickel, iron and cobalt. Alloys of nickel, iron and cobalt are available from Carpenter Technology (Reading, Pa) under the commercial designation "KOVAR." KOVAR's coefficient of thermal expansion is substantially similar to the preferred ceramic material of platform 211 and sidewall 237.

A plurality of internal leads 243 and 253 (shown symbolically as dashed lines in FIG. 3) are included for intercoupling among electrical component and SAW resonator 116. The plurality of leads 243 are coupled to a plurality of respective electrical contacts located at bottom portion 239 of wall 213. Preferably, bottom 239 of wall 213 is substantially planar for providing contact to circuit board 221. Internal leads 243 are formed over platform 211 and lower portion 237 of walls 213. Leads 243 provide electrical paths from resonator 116 and components mounted on the lower surface 231 of the platform 211 to the bottom 239 of the wall 213. Leads 243 include, but are not limited to, metallization trace patterns on layers of ceramic that make up the ceramic package as well as co-fired vias between layers. Oscillator 110 optionally includes plated half holes, called castellations, on the outside of downwardly extending sidewall 237. Such castellations facilitate inspection and testing of the electrical connections 245 (typically solder) between contacts and the circuit board 221.

Downwardly extending sidewall 237 may be coupled to the circuit board 221 in a variety of manners. Sidewall bottom 239 is configured to facilitate placement on a circuit board 221 or similar substrate. The plurality of contacts are suitably connected to respective leads and metallized paths of circuit board 221.

The plurality of internal leads 253 of circuit board 221 are coupled to a plurality of respective electrical contacts located on the outside portion 255 of top surface 231. Leads 253 provide electrical paths throughout circuit board 221, including connections among components (114, 128) and connections to surface mount pads 251. Leads 253 include, but are not limited to, metallization trace patterns on laminate circuit board layers.

Figure 4:
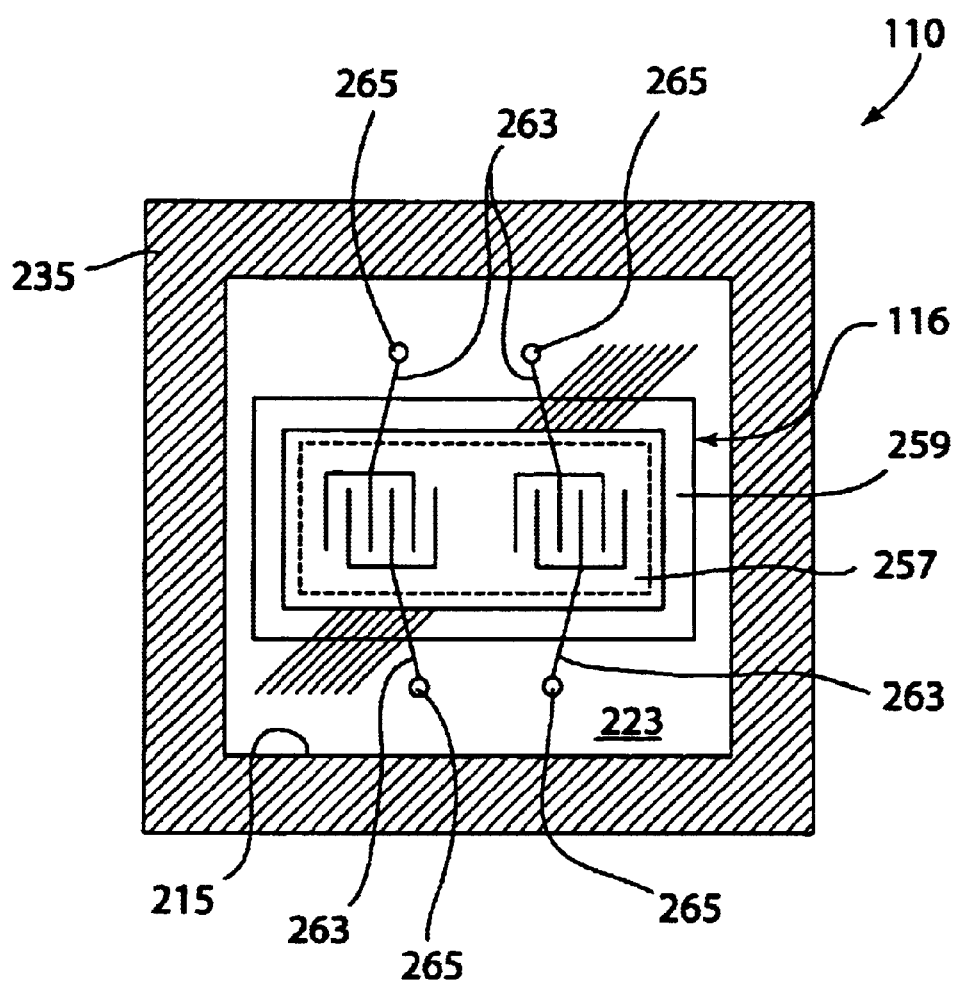
FIG. 4 is an exemplary schematic top view, partly in section, of the upper cavity of the packaged oscillator of FIG. 3 shown without a cover to reveal details of the SAW resonator mounting.

FIG. 4 is a schematic top view, partly in section, of upper cavity 215. FIG. 4 includes a view of SAW resonator die 116 with preferred wirebond connections 257 to connection pads 259 on upper surface 223 of platform 211 (FIG. 3).

Upper cavity 215 is configured to receive SAW resonator die 116. Resonator 116 is preferably a single-port configuration SAW resonator die. SAW resonator die 116 includes an active surface 257 on a surface wave propagating substrate 259. Substrate 259 is mounted to upper surface 223 of platform 211 with an adhesive 261 (FIG. 3). As illustrated, wirebonds 263 are preferred for connecting the transducers of SAW die 116 to contact pads (or points) 265 in upper surface 223. Contact pads 265 are connected through ceramic platform 211 and side walls 213 to the various electronic components of oscillator 110. Contact pads 265 preferably take the form of tungsten filled vias for connection to conductive traces on a ceramic layers of platform 211.

Although a wirebonded configuration for mounting SAW die 116 is preferred, a flip chip arrangement is also contemplated. In a flip chip arrangement, the active surface of the SAW die is reversed so as to face upper surface 223. Likewise, substrate 259 is then mounted to upper surface 223 with spacing elements that provide space between the active surface of the SAW die and platform 211.

Upper cavity 223 may hold additional components. However, having SAW resonator 116 isolated from some other components diminishes the possibility of contaminating the SAW active surface 257. More particularly, isolating and physically separating the SAW resonator 116 in upper cavity 215 from the components in the lower cavity 217 reduces the possibility of solder, organic underfill, and other unwanted contaminants adversely affecting the output frequency of SAW resonator 116.

Cover 219 is complementary configured to be received, and coupled to, wall 213, and specifically to upwardly extending sidewall 235. Cover 219 can be affixed in many ways including, but not limited to, being seam welded, solder sealed, ion beamed or laser welded. Cover 219 is affixed to upwardly extending sidewall 213 in a manner that provides a hermetic seal. Cover 219 may be formed from many materials known to those having ordinary skill in the art including, but not limited to, a metal and a metal alloy such as KOVAR.

Oscillator 110 is fabricated by the following steps: providing a U-shaped co-fired laminated ceramic package subpart (platform 211 with downwardly extending sidewalls 237); depositing a metal ring (e.g., Kovar) to form the upwardly extending sidewalls 235; dispensing epoxy adhesive on a central portion of platform 211 to receive SAW resonator die 116; mounting SAW resonator die 116; curing the epoxy in an oven for an appropriate period of time; wirebonding SAW resonator die; sealing upper cavity 215 by placing and sealing cover 219 with a seam weld; mounting electrical component(s), such as chip caps 134, 142, 152, 190, 192, 196 and 197, on lower surface 225 of lower cavity 217; providing a printed circuit board 221 having a first surface 231 with interconnections and contacts for receiving additional components and a second surface 233 with surface mount contacts 251; mounting additional electrical components onto upper surface 231 of circuit board 221; and attaching bottom 239 of downwardly extending sidewall 237 to circuit board 221.

Figure 5:
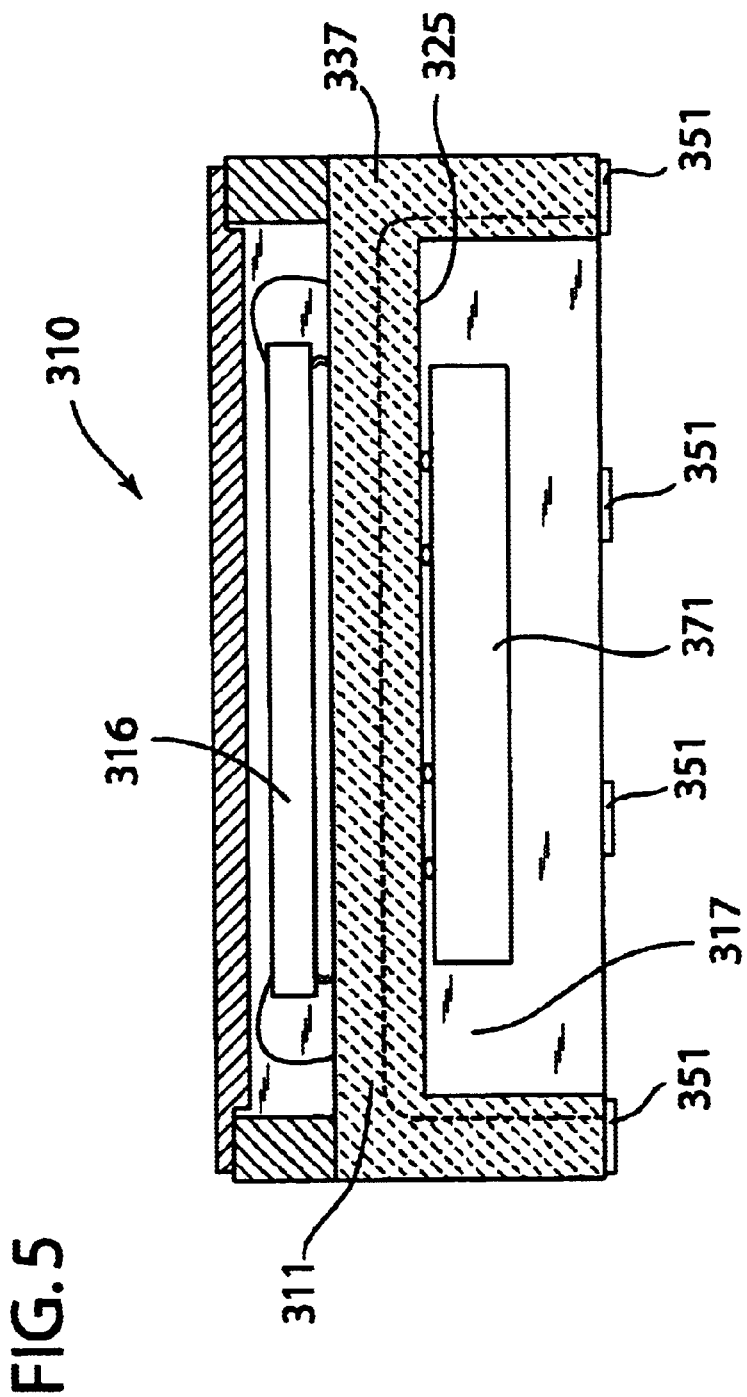
FIG. 5 is a schematic cross-section view of a packaged oscillator according to a preferred embodiment of this invention demonstrating an increased level of circuit integration.

FIG. 5 is a schematic cross-sectional view of a SAW resonator-based oscillator 310 wherein the required circuit elements (e.g., varactor 130, capacitor 142, transistor 132) and subcircuit modules (e.g., regulator 128, translator 114) are integrated into an application specific integrated circuit (ASIC) semiconductor chip 371. ASIC 371 is mounted in a lower cavity 317 of a double-sided package. A SAW resonator die 316 is mounted and interconnected as described with reference to oscillator 110 (FIGS. 3 and 4). ASIC 371 is preferably directly mounted to bottom surface 325 of platform 311. Downwardly extending sidewalls 337 terminate in surface mountable contact pads 351.

The further circuit integration reflected in FIG. 5 provides a surface mountable voltage controlled oscillator module without the printed circuit board substrate of oscillator 110.

Controllable SAW-based oscillator 110 includes a single port SAW resonator with a resonate frequency of 622.08 MHz. Specifications for selected circuit elements shown in FIG. 2 are presented in TABLE I, below.

TABLE I

| Reference ID (from FIG. 2) | Specification |
| --- | --- |
| C1 | 20 pF |
| C2, C4, C7, C8 | 10 pF |
| C3, C6, C11, C12, C15 | 100 pF |
| C5, C10, C14 | .1 µF |
| C9 | 4.7 pF |
| R1, R2 | 2.7 KΩ |
| R3 | 470 Ω |
| R4 | 100 Ω |
| R6 | 51 Ω |
| R7 | 10 Ω |
| L1, L3 | 39 nH |
| L2 | 27 nH |
| L4 | 15 nH |
| DC Supply VCC Range | 4.75–5.25 V |
| Control Input VC Range | .50–4.50 V |
| Target Load Impedance | 50 Ω |

The operating performance of controllable crystal oscillators 110 was measured over a range of voltages for voltage-variable control input 122. The results are presented in TABLE II, below.

TABLE II

| DC Voltage at Input 130 (DC Volts) | Digital Output 144A/B Frequency (ppm from 622.08 MHz) |
| --- | --- |
| 0.5 | −188.8 |
| 1.0 | −71.1 |

TABLE II-continued

| DC Voltage at Input 130 (DC Volts) | Digital Output 144A/B Frequency (ppm from 622.08 MHz) |
| --- | --- |
| 1.5 | 33.4 |
| 2.0 | 109.9 |
| 2.5 | 191.6 |
| 3.0 | 290.9 |
| 3.5 | 432.6 |
| 4.0 | 599.4 |
| 4.5 | 740.0 |

The data was recorded using an HP4396A Network/Spectrum Analyzer, available from Agilent Technologies, Inc. (Palo Alto, Calif.), at an uncontrolled (but substantially room) temperature with a load impedance of 50 ohms ($\Omega$). The output operating frequency is selectable in the range from about 621,963 kilohertz to about 622,540 kilohertz. The output frequency (at 172/174) to control input voltage (at 122) operating has a best straight-line nonlinearity of less than about 10 percent.

The test results can be characterized in that the operating digital output frequency of controllable oscillator 110 is within the area defined between the following two equations:

$$f1_{output} = 0.119436(V_{control}) + 621.9430 \text{ Megahertz}$$

$$f2_{output} = 0.119436(V_{control}) + 621.9679 \text{ Megahertz}$$

for $V_{control}$ values in the range of about 0.50 volts to about 4.50 volts, where $V_{control}$ is a DC voltage level of the voltage-variable input. Additional test results are summarized in TABLE III, below.

TABLE III

Output 172/174 RMS Phase Jitter Performance

| type | peak to peak |
| --- | --- |
| 12 kHz to 20 MHz | ≦8 picoseconds |
| 50 kHz to 80 MHz | ≦8 picoseconds |

The rise and/or fall time for the PECL output did not exceed about 400 picoseconds.

Phase jitter was measured using the Agilent Model HP54720D 1.2 GHz scope and PC-based software available from Amherst Systems Associates under the designation "ASA M1 Time-Interval Measurement System." The M1 system extracts real-time, uninterpolated waveform information from the scope and computes the crossing times of user-specified thresholds. The Agilent-Amherst system specified above can measure both peak-to-peak phase jitter and rms phase jitter. The peak-to-peak measurement is typically about 6–7 times larger than the rms jitter measurement.

Table V contains a list of additional example SAW-based oscillators prepared according to general circuit layout presented in FIG. 2 and packaging of FIGS. 3 and 4.

TABLE IV

| Oscillator Example | Frequency Range (kHz) | Nominal Center Frequency (kHz) |
| --- | --- | --- |
| 1 | 622,048–622,111 | 622,080 |
| 2 | 622,018–622,142 | 622,080 |

TABLE IV-continued

| Oscillator Example | Frequency Range (kHz) | Nominal Center Frequency (kHz) |
| --- | --- | --- |
| 3 | 644,466–644,595 | 644,531 |
| 4 | 666,447–666,580 | 666,514 |
| 5 | 669,259–669,393 | 669,326 |

Numerous variations and modifications of the embodiments described above may be effected without departing from the spirit and scope of the novel features of the invention. No limitations with respect to the system illustrated herein are intended or should be inferred. It is, of course, intended to cover by the appended claims all such modifications as fall within the scope of the claims.

I claim:

1. A controllable oscillator suitable for digital signal clock recovery, the oscillator comprising:

a SAW oscillator circuit for generating a controlled-frequency output signal and having a voltage-variable control input for adjusting a frequency of the controlled-frequency output signal, the oscillator circuit including a voltage variable capacitive element responsive to the control input, a surface acoustic wave (SAW) resonator operably linked to the voltage variable capacitive element, and a gain stage for energizing the SAW resonator;

a sinewave-to-logic level translator circuit operably linked to the SAW oscillator circuit for generating a digital logic output signal having substantially the same frequency as the controlled-frequency output signal;

a double-sided package including a platform having a central portion and an outer portion, sidewalls extending substantially upwardly and substantially downwardly from the outer portion of the platform, the upwardly extending sidewalls and the platform forming a first cavity adapted to receive and electrically connect the SAW resonator, the downwardly extending sidewalls and the platform forming a second cavity adapted to receive and electrically connect at least one electronic component; and a cover coupled with the first cavity defining a hermetic environment for containing the SAW resonator.

2. The oscillator according to claim 1 exhibiting an operating frequency for the digital output within the area defined between the following two equations:

$$f1_{output} = 0.119436(V_{control}) + 621.9679 \text{ Megahertz}$$

$$f2_{output} = 0.119436(V_{control}) + 621.9430 \text{ Megahertz}$$

for $V_{control}$ values in the range of about 0.15 volts to about 3.15 volts, where $V_{control}$ is a DC voltage level of the voltage-variable input and wherein the operating RMS phase jitter of the digital output is at most about 8 picoseconds measured in a 12 kHz to 20 MHz bandwidth.

3. The oscillator according to claim 1 wherein the digital logic output has a controllable operating frequency in the range from at least about 622,048 kilohertz to at least about 622,111 kilohertz.

4. The oscillator according to claim 1 wherein the digital logic output has a controllable operating frequency in the range from about 622,018 kilohertz to about 622,142 kilohertz.

5. The oscillator according to claim 1 wherein the digital logic output has a controllable operating frequency in the range from about 644,466 kilohertz to about 644,595 kilohertz.

6. The oscillator according to claim 1 wherein the digital logic output has a controllable operating frequency in the range from about 666,447 kilohertz to about 666,580 kilohertz.

7. The oscillator according to claim 1 wherein the digital logic output has a controllable operating frequency in the range from about 669.259 kilohertz to about 669.393 kilohertz.

8. The oscillator according to claim 1 wherein the translator circuit is a differential receiver adapted to generate the digital output signal at voltage levels conventional for positive-referenced emitter coupled logic (PECL) complementary.

9. The oscillator according to claim 1 wherein the translator is a differential ECL driver.

10. The oscillator according to claim 1 wherein the differential receiver is adapted for creating a digital output signal oscillating between voltage levels conventional for 10K PECL or 100K PECL.

11. The oscillator according to claim 1 wherein the translator circuit is adapted for creating a digital output signal oscillating between voltage levels conventional for a semiconductor circuit technology selected from the group connoting essentially of transistor-transistor logic, emitter coupled logic, CMOS, MOSFET, GaAS field effect, HCMOS, MESFET, HEMT, PHEMT, CML and LVDS.

12. The oscillator according to claim 1 wherein voltage variable capacitive element is a discrete varactor received in the second cavity and operably linked to the SAW resonator.

13. The oscillator according to claim 1 wherein the gain stage and the voltage variable capacitive element are received in the second cavity.

14. The oscillator according to claim 1 further comprising a laminate substrate coupled with the second cavity.

15. The oscillator according to claim 14 wherein the platform has a second-cavity side, and at least one electronic component is mounted on the second-cavity side and at least one electronic component is mounted on the laminate substrate.

16. The oscillator according to claim 1 further comprising a printed circuit board coupled with the second cavity, the printed circuit board having a cavity facing surface adapted to receive at least one electronic component and an outward facing surface having a plurality of integral contacts adapted to facilitate electrical surface mountable connection to an electrical device.

17. The oscillator according to claim 1 wherein the SAW resonator is tunable and the second cavity includes contacts conductively linked to the resonator for tuning.

18. The oscillator according to claim 1 having a substantially rectangular footprint of about 5 millimeters by 7 millimeters.

19. The oscillator according to claim 1 having a footprint of an area less than about 40 square millimeters.

20. The oscillator according to claim 1 having a substantially rectangular footprint of about 3.2 millimeters by 5 millimeters.

21. The oscillator according to claim 1 having a footprint of an area less than about 20 square millimeters.

22. The oscillator according to claim 1 exhibiting an operating frequency for the digital output within the area defined between the following two equations:

$$f1_{output} = 0.119436(V_{control}) + 621.9679 Megahertz$$

$$f2_{output} = 0.119436(V_{control}) + 621.9430 Megahertz$$

for $V_{control}$ values in the range of about 0.15 volts to about 3.15 volts, where $V_{control}$ is a DC voltage level of the voltage-variable input and wherein the operating RMS phase jitter of the digital output is at most about 8 picoseconds measured in a 50 kHz to 80 MHz bandwidth.

* * * * *